(12) United States Patent
Bauer et al.

(10) Patent No.: US 8,759,677 B2
(45) Date of Patent: Jun. 24, 2014

(54) HERMETICALLY SEALED HOUSING FOR ELECTRONIC COMPONENTS AND MANUFACTURING METHOD

(75) Inventors: Christian Bauer, Munich (DE); Hans Krueger, Munich (DE); Juergen Portmann, Munich (DE); Alois Stelzl, Munich (DE)

(73) Assignee: Epcos AG, Munich (DE)

( * ) Notice: Subject to any disclaimer, the term of this patent is extended or adjusted under 35 U.S.C. 154(b) by 161 days.

(21) Appl. No.: 12/993,299

(22) PCT Filed: May 26, 2009

(86) PCT No.: PCT/EP2009/056377
§ 371 (c)(1),
(2), (4) Date: Jan. 24, 2011

(87) PCT Pub. No.: WO2009/144224
PCT Pub. Date: Dec. 3, 2009

(65) Prior Publication Data
US 2011/0114355 A1    May 19, 2011

(30) Foreign Application Priority Data
May 27, 2008    (DE) .................. 10 2008 025 202

(51) Int. Cl.
*H01J 5/00* (2006.01)
*H01J 15/00* (2006.01)
*H05K 5/06* (2006.01)
*H05H 1/00* (2006.01)
*H05K 7/00* (2006.01)
*H05K 7/10* (2006.01)
*H05K 7/12* (2006.01)

(52) U.S. Cl.
USPC ............... 174/50.56; 174/50.5; 174/50.59; 361/751; 361/758; 361/760; 361/770

(58) Field of Classification Search
USPC ......... 174/50.5, 50, 50.51, 50.56, 50.59, 521, 174/527; 361/748, 751, 752, 753, 758, 760, 361/770
See application file for complete search history.

(56) References Cited

U.S. PATENT DOCUMENTS 3,320,351 A  * 5/1967 Glickman ............... 174/50.56
4,805,009 A    2/1989 Pryor et al.
(Continued)

FOREIGN PATENT DOCUMENTS

DE    19749987 A1    6/1999
DE    10164494 A1    7/2003
(Continued)

OTHER PUBLICATIONS

Written Opinion corresponding to International Patent Application No. PCT/EP2009/056377, European Patent Office, dated Sep. 1, 2009, 5 pages.
(Continued)

*Primary Examiner* — Hoa C Nguyen
*Assistant Examiner* — Binh Tran
(74) *Attorney, Agent, or Firm* — Nixon Peabody LLP (57) ABSTRACT

Frames (3) applied on a wafer (1) are leveled and covered with a covering film, such that gas-tight housings are formed for component structures (5), in particular for filter or MEMS structures. Inner columns (4) can be provided for supporting the housing and for the ground connection; outer columns (4) can be provided for the electrical connection and are connected to the component structures by means of conductor tracks (6) that are electrically insulated from the frames (3).

12 Claims, 4 Drawing Sheets

(56) References Cited

U.S. PATENT DOCUMENTS

| | | |
|---|---|---|
| 7,239,023 B2 | 7/2007 | Yu-Tung et al. |
| 7,576,426 B2 * | 8/2009 | Gan et al. ............... 257/710 |
| 2003/0102540 A1 | 6/2003 | Lee |
| 2004/0140557 A1 * | 7/2004 | Sun et al. ............... 257/734 |
| 2008/0111203 A1 * | 5/2008 | Pan et al. ............... 257/415 |
| 2008/0127471 A1 * | 6/2008 | Matsuzawa ............. 29/25.35 |
| 2008/0157897 A1 * | 7/2008 | Tilmans et al. .......... 333/105 |
| 2008/0271908 A1 * | 11/2008 | Yamamoto et al. ...... 174/50.5 |

FOREIGN PATENT DOCUMENTS

| | | |
|---|---|---|
| DE | 102004040465 B4 | 7/2009 |
| EP | 0100817 B1 | 4/1989 |
| JP | 2005335433 | 12/1993 |
| JP | 10-098121 A | 4/1998 |
| JP | 2000-299396 A | 10/2000 |
| JP | 2005262382 | 9/2005 |
| JP | 2005528782 | 9/2005 |
| JP | 2007160499 | 6/2007 |
| WO | WO 2006/048982 A1 | 11/2006 |

OTHER PUBLICATIONS

International Search Report corresponding to International Patent Application No. PCT/EP2009/056377, European Patent Office, dated Sep. 1, 2009, 4 pages.

Examination Report for corresponding Japanese Patent Application No. 2011-510989, Dated Jun. 5, 2013 (4 pages).

Office Action corresponding to co-pending Japanese Patent Application Serial No. 2011-510989, Japanese Patent Office, dated Feb. 5, 2014; (2 pages).

* cited by examiner

HERMETICALLY SEALED HOUSING FOR ELECTRONIC COMPONENTS AND MANUFACTURING METHOD

CROSS-REFERENCE TO RELATED APPLICATIONS

This application is a U.S. National Stage of International Application No. PCT/EP2009/056377, filed May 26, 2009, which claims the benefit of Germany Patent Application No. 102008025202.6, filed on May 27, 2008, both of which are incorporated herein by reference in their entireties.

The present invention concerns the manufacturing of hermetically sealed and, if necessary, electrically shielded housings on arbitrary gas-tight substrates.

In a large number of electronic components, primarily in components comprising surface-sensitive structures such as e.g. SAW components (surface acoustic wave filters) or MEMS components (micro-electro-mechanical systems), it is necessary to fit a housing which largely protects the component against ambient influences and, in particular, can be manufactured in a gas-tight fashion. Such housings are intended to be able to be manufactured while the components are in the assemblage of a wafer, e.g. of a silicon substrate. However, any arbitrary gas-tight substrate should be suitable for this, in principle. Moreover, an electrical connection of the component parts of the component toward the outside must be able to be fitted. Hitherto, such housings have been manufactured by various manufacturing methods e.g. as so-called wafer level packages (WLP) or chip sized packages. A manufacture of the chip sized packages on the wafer is then also referred to as wafer level chip sized package (WLCSP).

DE 10 2004 040 465 A1 describes a housing wherein electronic components are connected to a substrate in a flip-chip arrangement. A frame structure is arranged between the component and the substrate and laterally encloses a cavity present therebetween. The frame structure is formed from a buffer layer, which can be an organic compound, in particular a polymer, and also electrically conductive and which is compressed in order to increase its density. The buffer layer is formed with the structure provided by a procedure in which a layer initially applied over the whole area is removed proportionally by means of photolithography or laser or a buffer layer with preformed openings is used. The top side of the component, facing away from the substrate, can be covered with a conductive layer serving for electrical shielding.

JP 2000-299396 A describes an air-tight housing for electronic components, wherein a frame structure composed of an initially not yet cured, liquefied potting material is produced. A cover material is pressed onto the frame structure for sealing purposes and in this case supported by spacer elements, and the potting material is then heated for the purpose of curing.

It is an object of the present invention to specify an improved housing that can be manufactured in a simple manner for surface-sensitive components and a method by which such housings can be manufactured in a gas-tight fashion.

This object is achieved by means of the housing comprising the features of claim 1 and by means of the manufacturing method comprising the features of claim 8. Configurations emerge from the dependent claims.

The housing comprises a metal frame, which is arranged on a top side of a gas-tight substrate and completely encloses at least surface-sensitive regions of said top side. In particular, the frame can surround surface-sensitive structures arranged in said region. Preferably, the substrate used is a wafer on which are manufactured housings for a multiplicity of components jointly. Pillars, that is to say small columns, preferably likewise composed of metal, can be applied together with the frames. The pillars can be arranged in those regions of the top side which are enclosed by the frames, or outside said regions. For the pillars arranged outside the frames, if appropriate electrically conductive feed-throughs from the respective component structure to the relevant pillar are present below the frames, said feed-throughs being electrically insulated from the relevant frame. The electrical insulation of the feed-through can be effected by hermetically sealing inorganic layers or by quasi-hermetically sealing organic layers.

The top sides of the frames and the upper ends of the pillars are brought to the same height above the wafer surface by planarization as necessary. The planarization can be effected in accordance with the planarization process which is known per se and which usually involves producing a top side coplanar with respect to the bearing area of the wafer rear side, which bears on a planar chuck, preferably by means of diamond milling in the case of metals. The accuracy and quality of the surface that can be obtained are extremely high, thus giving rise to optically specularly reflective surfaces that are planar in the sub-μm plane. In the subsequent process of wafer bonding, the wafer bearing on the chuck, said wafer now being provided with metal frames that are parallel to the chuck and milled in plane fashion, is connected to a film.

The film is applied to the planarized structures of the frames and pillars in such a way that a gas-tight connection is produced between the frames and the film. The film can be a metal or a metal composite or else be formed from an organic or inorganic, non-conductive or semiconducting base film metallized on one side or on both sides. Organic base films can be additionally stabilized by incorporation of fibers, or anisotropic mechanical properties can be imparted to them.

Examples of the housing and of the manufacturing method will be described in greater detail below with reference to the accompanying figures.

Figure 1:
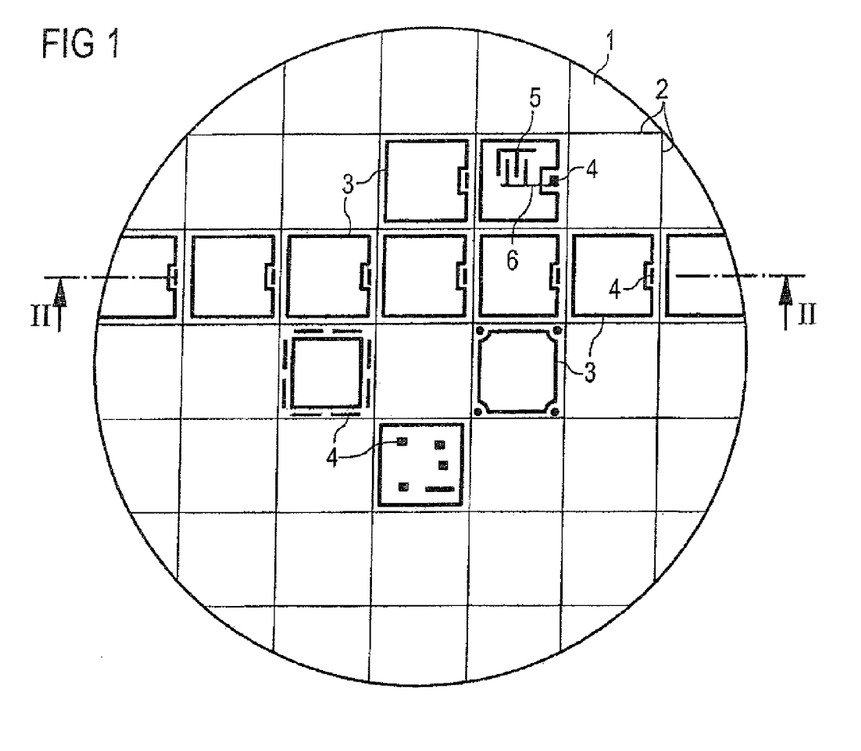
FIG. 1 shows a plan view of a wafer provided with metal frames for housings.

FIG. 1 shows a plan view of a wafer 1, on which a multiplicity of components are produced simultaneously. The wafer is intended to be separated into the housed individual components later. That is done along the horizontal and vertical separating lines 2 depicted in FIG. 1. A method known per se such as e.g. laser action, sawing or etching can be used for this purpose. In the embodiment described below, the individual components provided are in each case arranged within one of the regions of the wafer which are bordered by the separated lines 2. Only one of the component structures 5 present is depicted as an example in FIG. 1. The number of components produced on the wafer can additionally be significantly greater than illustrated, and so the plan view in FIG. 1 can also be regarded as an excerpt from a significantly larger wafer.

Frames are in each case produced for the housings provided, said frames in this embodiment being metal frames 3, which can be formed e.g. from copper, nickel, silver or gold or else from two or more metals, e.g. from copper and tin. The metal frames 3 are preferably applied by electroforming. Metallic pillars having any desired base areas, designated hereinafter as metal columns 4, can also be produced together with the metal frames 3. The metal columns 4 are preferably produced from the same metal or the same metal composition as the metal frames 3. The metal columns 4 can in each case be arranged within a metal frame 3, that is to say in the region enclosed by the metal frame, or else outside the latter.

In the case of a soldering connection, the metal composite of the metal frame (of the metal columns), consists of a sequence of at least one metal having a high melting point (e.g. Cu, Ni, Ag, Au), or a metal alloy having a high melting point and a metal having a low melting point (e.g. Sn, In) or a metal alloy having a low melting point (e.g. Sn/Ag/Cu, Sn/Ag, Sn/Cu, Sn/Pb or the like). Preferably in combination with the covering film, between metal frames/columns and covering film after the connection process, an alloy which does not melt at reflow temperatures (>260° C.) is intended to be formed, e.g. $Sn_{20}Au_{80}$ (melting point 283° C.), or SnCu (solid method, melting point above 400° C.).

When thermosonic bonding is employed, combinations of metal frames/columns and covering film in which the connection partners are readily bondable are particularly suitable, e.g. Au/Au, Al/Al, Cu/Cu, Ag/Ag etc. Disturbing oxide layers can be prevented by approximately 100 nm thick non-oxidizing metal layers or metal layer sequences. The thermosonic method can also be used for connecting metal frames/columns and covering film if metal frames/columns and/or covering film are soldered. In this case, the thermosonic method also serves for destroying oxide layers on the solders.

Alternatively, the solder layer can be provided with a layer that does not oxidize, e.g. Ag, Pd, Pt, Ag/Pd, Ag/Pt or the like. Typical layer thicknesses are between 70 nm and 150 nm. Alternatively, a thin organic layer that dissolves the oxide layer at the temperatures of the connection process can also be applied to the solder layer.

The expansion coefficient of the substrate can be taken into account in the composition of the covering film in order to avoid problems resulting from a mismatch of the expansion coefficients of substrate and covering film. Thus, e.g. a Vacon film or a metallized glass film can be used as the covering film in order to achieve the best possible match to the thermal expansion of a substrate composed of silicon.

Alternatively, a very thin metal film, e.g. Au, Ag or Cu having a typical thickness of less than 6 μm, can be used as the covering film. After the connection between metal frames/columns and covering film has been produced, the covering film can be reinforced electrolytically at temperatures near the ambient temperature (e.g. a Cu film with Cu or Ni), preferably up to a thickness which ensures gas impermeability or permits molding pressures of up to 10 MPa. In the case of substrates having an anisotropic thermal expansion coefficient, such as e.g. LT ($LiTaO_3$), having values of the expansion coefficient of between 7 ppm/K and 14 ppm/K in the direction orthogonal thereto, a metallization whose expansion coefficient is approximately in the middle, typically approximately 10.5 ppm/K, is advantageous.

If, on account of mismatch, the flexure of the wafer after the connection process and cooling to ambient temperature is too great for the subsequent process steps, then the wafer/metal composite can also be separated into individual components at the temperature of the connection process (that is to say before cooling), e.g. by laser cutting and laser scribing.

The temperatures for the connection process can be considerably reduced if the partners to be connected are provided with a nanostructuring.

FIG. 1 illustrates a large number of different configurations of the frames and pillars. The metal columns 4 can be provided for supporting a covering film which is applied on the top side and which seals the housing. The metal columns 4 can instead or additionally also be provided for the electrical connection of the components. One example of a component structure 5 is depicted in FIG. 1, which structure can be e.g. a surface acoustic wave filter. In the component structure 5, parallel lateral conductor tracks, which can be copper, by way of example, are provided for the electrical connection, while conductor tracks connected thereto and intermeshed with one another in a comb-like manner, e.g. composed of AlCu, are provided for the function of the component. For the external electrical connection, a conductor track 6 is provided which electrically conductively connects the component structure to an external metal column 4. The conductor track 6 is led through below the metal frame 3 and insulated from the metal frame 3 by a thin intermediate layer composed of electrically insulating material. An electrical voltage for the operation of the component can be applied to the relevant metal column arranged outside the metal frame. The other connection of the component structure 5 is grounded, which can be effected, in a manner described below, by metal columns applied on the component structures 5 and by an at least partly electrically conductive covering film. The ground connection can instead also be effected by a connection of corresponding conductor tracks to one or a plurality, if appropriate also to all, of the frames provided.

Figure 2:
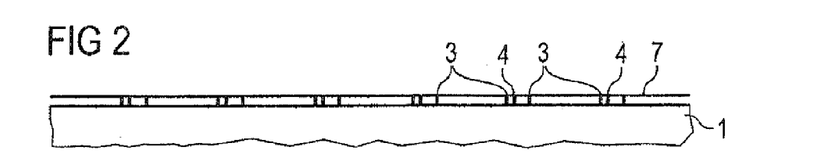
FIG. 2 shows the cross section—marked in FIG. 1—through the wafer after the application of the covering film.

FIG. 2 shows the cross section marked in FIG. 1 with the wafer 1 and a plurality of metal frames 3 and metal columns 4. The dimensions of the regions enclosed by the metal frames 3 and the arrangement and number of the metal columns 4 are embodied in any desired manner, in principle, and in the cross section in FIG. 2 are merely illustrated as a simple example, corresponding to the simple example in FIG. 1. FIG. 2 additionally shows that, in order to complete the housings, a covering film 7 is applied to the frames and pillars on the top side. The covering film 7 can consist of a metal, such as e.g. copper, nickel, silver or gold. Instead, for the covering film, it is possible to use a metal composite, e.g. composed of copper and tin, or composed of copper, tin and gold, or else a metal alloy such as e.g. Vacon, an iron-nickel-cobalt alloy, which is preferably nickel-plated or additionally copper-plated or zinc-plated.

Figure 3:
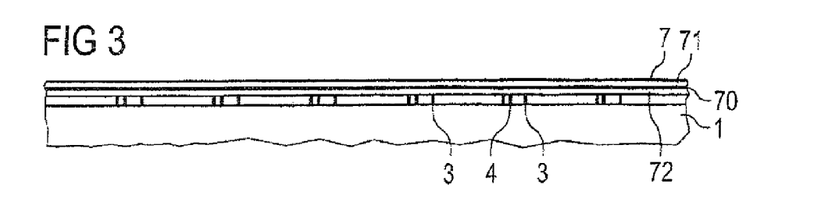
FIG. 3 shows a cross section in accordance with FIG. 2 for another embodiment.

FIG. 3 shows a cross section in accordance with FIG. 2 for a further embodiment, wherein the covering film 7 is embodied in multilayered fashion. A carrier film 70 composed of glass, ceramic or plastic (e.g. polyimide [Kapton], LCP [liquid crystal polymer], BCB [benzocyclobutene]) is provided with a metallization on the top side and on the underside. The upper metallization 71, which is arranged in a manner facing away from the wafer 1, is composed e.g. of copper, and the lower metallization 72, which is arranged opposite the wafer 1, is composed e.g. of copper and tin. It may suffice for a metallization to be present only on one side of the carrier film 70. Preferably, the lower metallization 72 is present, which produces a direct electrically conductive contact with the metal frames 3 and the metal columns 4.

Figure 4:
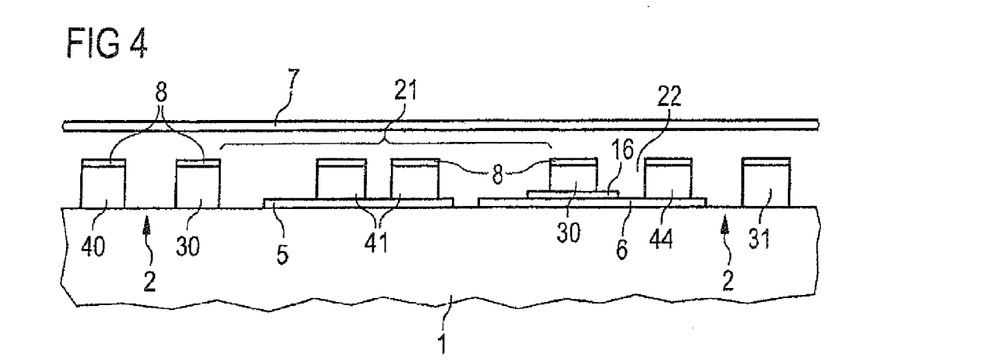
FIG. 4 shows a cross section in accordance with FIG. 2 for a process step for the application of the covering film.

A description will now be given of an embodiment of the manufacturing method with reference to FIGS. 4 to 10, which in each case show cross sections corresponding to FIGS. 2 and 3. FIG. 4 shows a cross section through the wafer 1 in an excerpt which approximately encompasses the region of a component. The separating lines 2 are situated approximately at the locations marked in FIG. 4. FIG. 4 depicts the cross sections of a metal frame 30 surrounding a component structure 5 for one embodiment. The right-hand side of FIG. 4 depicts a cross section of a further metal frame 31 for a component adjacent on this side. Cross sections of outer metal columns 40, 44 arranged outside the respective metal frames are likewise depicted. In accordance with the plan view in FIG. 1, it is assumed in the embodiment in FIG. 4 that the metal column 44 is associated with the component structure 5 arranged in the metal frame 30, while the outer metal column 40 depicted on the left-hand side is associated with the component adjacent on this side. The arrangement illustrated in FIG. 4 thus approximately corresponds to the arrangement of the cross section in FIG. 2, with the difference that FIG. 4 also depicts inner metal columns 41, which are present in the region enclosed by the metal frame 30. In this embodiment, the inner metal columns 41 are provided both for supporting the covering film 7 and for the ground connection and are therefore depicted in FIG. 4 as an example on a conductor track of the component structure 5. The component structure 5 is electrically conductively connected to the covering film 7 via the inner metal columns 41. Metallizations 8 are in each case applied on the metal frames 30, 31 and the metal columns 40, 41, 44, which metallizations can be produced e.g. by the metal frames and metal columns being electrolytically zinc-plated on the top side.

The component structure 5 is arranged within the region 21 enclosed by the metal frame 30. The associated outer metal column 44 is separated from the metal frame 30 by an intermediate region 22. The outer metal column 44 serves for the electrical connection of the component structure 5 via suitable conductor tracks. For this purpose, it is necessary to provide an electrically conductive connection between the outer metal column 44 and conductors in the region 21 enclosed by the metal frame 30. For this purpose, a conductor track 6 is present which is applied to the top side of the wafer 1 and structured before the production of the metal frame 30. For the electrical insulation from the metal frame 30, an insulation 16 composed of an electrically insulating material is applied on the conductor track 6. The metal frame 30 together with the metal columns in the form provided is produced thereon, e.g. by electroforming, such that the metal frame is arranged above the insulation 16 in sections. Owing to the non-planar top side of the wafer 1, initially the top sides of the metal frames and metal columns are also not at the same level. Therefore, a planarization step is carried out, by means of which the top sides of the metal frames 30, 31 and the upper ends of the metal columns 40, 41, 44 are leveled to the same level. The covering film 7 can then be applied to the planarized metal component parts in a level fashion.

Figure 5:
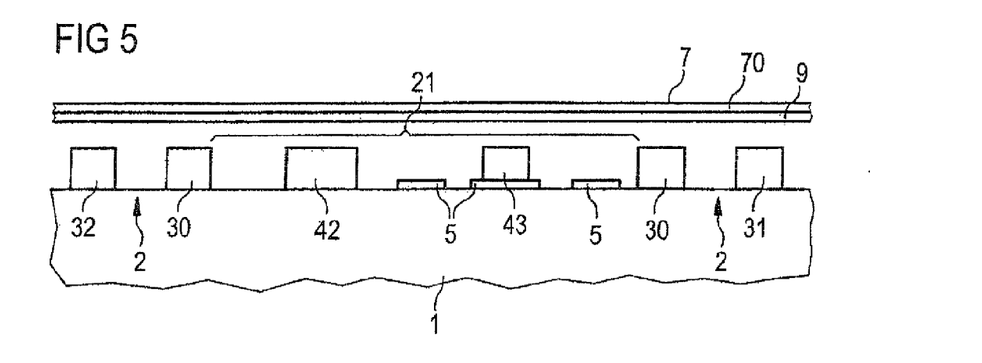
FIG. 5 shows a cross section in accordance with FIG. 4 for a further embodiment.

FIG. 5 shows a cross section in accordance with the cross section in FIG. 4 for a further embodiment, wherein the covering film 7 comprises a carrier film 70, e.g. composed of glass, ceramic or plastic, and the underside of the carrier film 70 is provided with a metallization 9, e.g. composed of copper or nickel. The metallization 9 can be structured in accordance with the arrangement of the metal frames and metal columns, such that the metal component parts provided for a different electrical potential remain electrically isolated from one another. As a further example, FIG. 5 illustrates an arrangement of inner metal columns 42, 43 within the region 21 enclosed by the metal frame 30, this arrangement differing from the embodiment in FIG. 4. In the case of this embodiment, no outer metal columns are present, or at least no outer metal columns are present in the cross section illustrated. Metal frames 31, 32 of the adjacent components are also depicted on the right and left in FIG. 5. The component structure 5 present within the metal frame 30 comprises a plurality of component parts. One of these component parts, illustrated as a conductor track, is provided with a metal column 43, which produces an electrical connection to the metallization 9 of the covering film 7. The inner metal column 42 on the left-hand side is not in contact with component parts of the component structure 5 and is provided merely as a mechanical support of the covering film 7 in this example. FIGS. 4 and 5 show the arrangement in each case in the method step directly before the application of the covering film 7.

Figure 6:
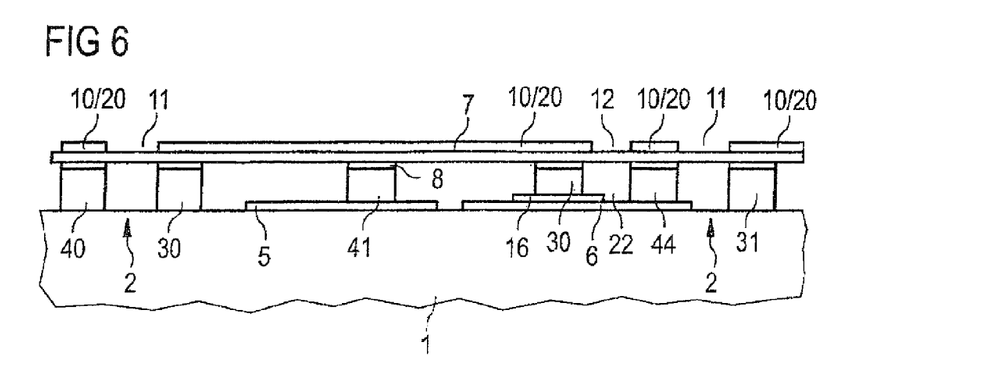
FIG. 6 shows a cross section in accordance with FIG. 4 after the application of the covering film and a resist mask.

FIG. 6 shows a cross section in accordance with FIG. 4 for a further method step after the application of the covering film 7. The covering film 7 is electrically conductively connected to the metallizations 8 and hermetically seals in particular the inner regions of the metal frames toward the outside. In this embodiment, the covering film 7 consists of one or a plurality of metals. Instead, it is possible to use a multilayered covering film, e.g. in accordance with FIGS. 3 and 5. A resist mask 10 is applied on the top side and provided with openings 11 above the separating lines 2 and with further openings 12 above the intermediate regions 22 between the metal frames and the outer metal columns. The other component parts depicted in FIG. 6 correspond to the component parts in FIG. 4 and are provided with the same reference symbols.

By means of the resist mask 10, the material of the covering film 7 is removed in the region of the openings 11 and the further openings 12 by etching. The result of this method step is illustrated in the cross section in FIG. 7. The covering film 7 has been removed above the separating lines 2 and above the intermediate regions 22 between the metal frames 30 and the outer metal columns 44. The remaining portions of the covering film 7 form the cover of the manufactured housings, the side walls of which are formed by the metal frames 30. Further portions of the covering film 7 have remained on the outer metal columns 40, 44. Instead of a photoresist, some other polymer layer or polymer layer sequence that can be structured can be applied. The housings can be separated from one another by laser cutting instead of by the application of an etching method.

Figure 7:
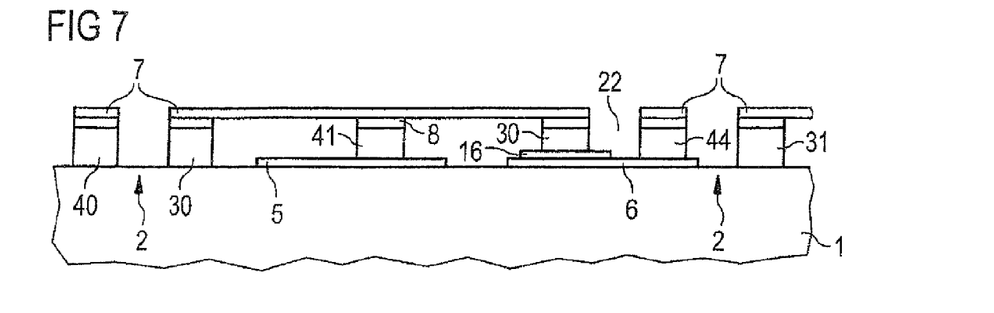
FIG. 7 shows a cross section in accordance with FIG. 6 after the production of openings in the covering film.
Figure 8:
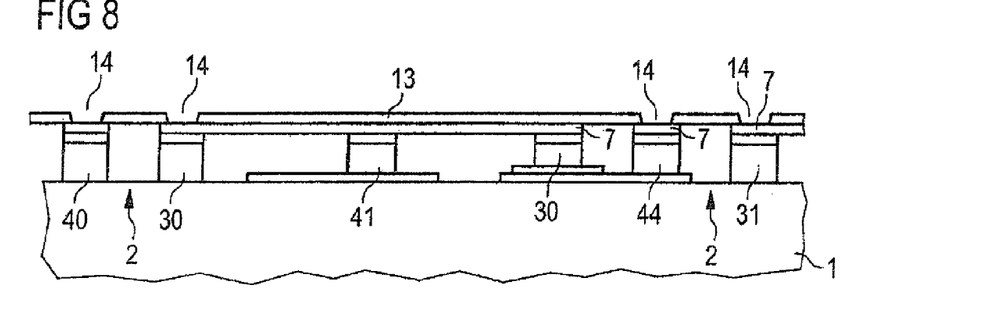
FIG. 8 shows a cross section in accordance with FIG. 7 after the application of an insulation layer.

FIG. 8 shows a cross section in accordance with FIG. 7 after the application of an initially whole-area insulation layer 13, in which openings 14 are produced in regions in which electrical contact is subsequently intended to be made with the metal component parts.

Figure 9:
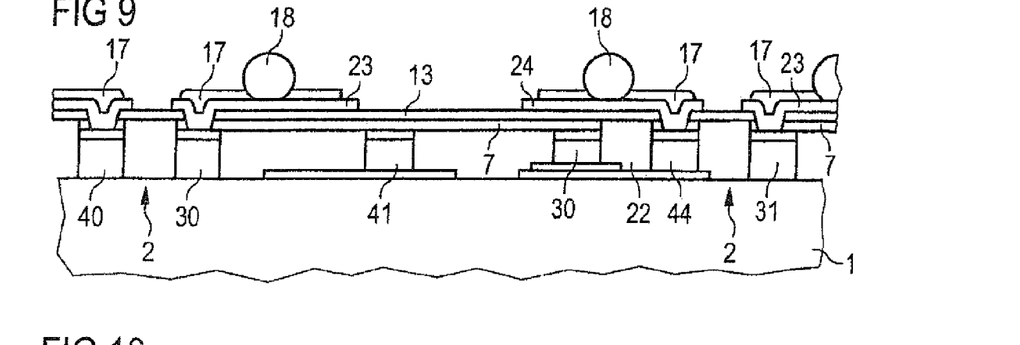
FIG. 9 shows a cross section in accordance with FIG. 8 after the production of connection metallizations and the application of solder balls.

FIG. 9 shows a cross section in accordance with FIG. 8 after the production of a structured metallization 23 for the connection of the metal frames and a further structured metallization 24 for the connection of the outer metal columns. For these metallizations, firstly a metallization can be applied over the whole area and then structured using a mask. Instead, it is also possible to apply firstly a mask and then the metallization over the whole area and to partly remove the metallization using the mask by means of a lift-off technique known per se, such that the metallizations 23, 24 illustrated in FIG. 9 remain. A solder resist layer 17 is then preferably applied, which is provided with openings in those regions in which the solder balls 18 for the external electrical connection are subsequently arranged. The solder resist layer 17 prevents the solder material from flowing, such that the solder material approximately maintains the form of the solder balls 18 in FIG. 9.

Figure 10:
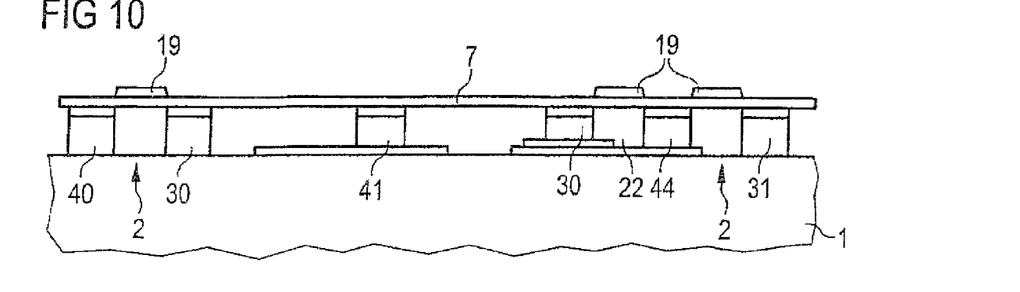
FIG. 10 shows a cross section in accordance with FIG. 6 with a complementary resist mask.
Figure 11:
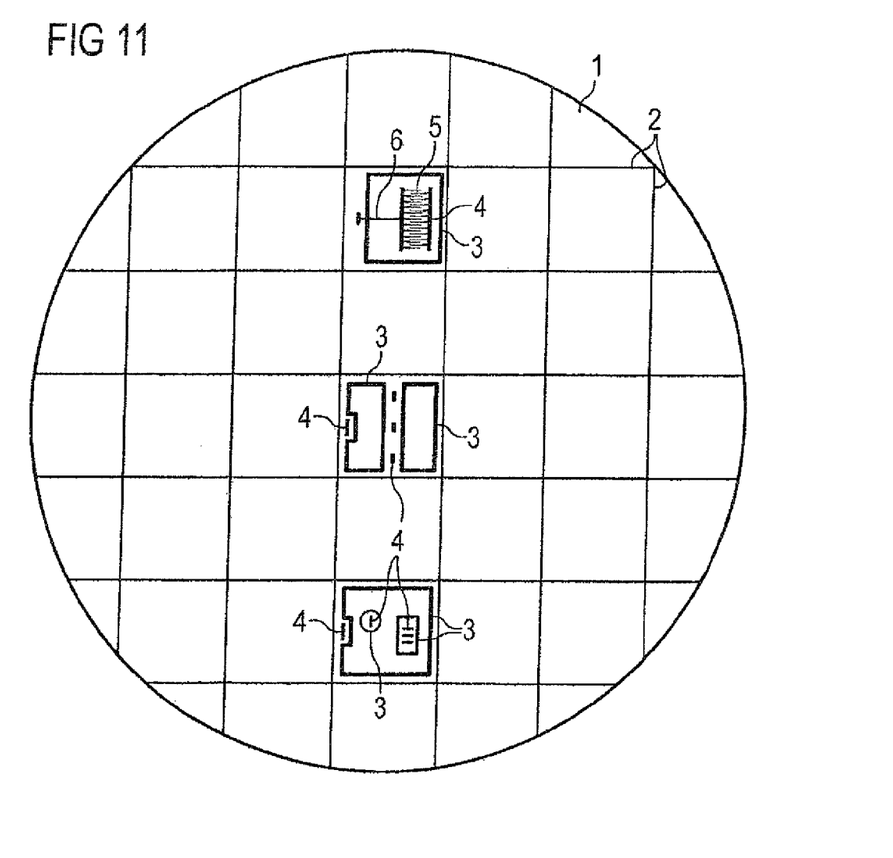
FIG. 11 shows a further plan view of a wafer provided with metal frames for housings.

FIG. 10 shows a across section in accordance with FIG. 6 with a further resist mask 19, which is approximately complementary to the resist mask 10 illustrated in FIG. 6. That means that the further resist mask 19 covers the regions above the separating lines 2 and above the intermediate regions 22 between the metal frames and the outer metal columns. Instead of a resist mask 19, some other polymer layer or polymer layer sequence, which can be structured by means of a laser, for example, can also be applied and correspondingly structured or a structured polymer layer can be produced by means of a printing method, such as e.g. jet printing. A further metal layer is then applied, preferably electrolytically, to the top side of the covering film 7, said further metal layer reinforcing the covering film 7 in the regions of the openings of the further resist mask 19. After the removal of the further resist mask 19, a structure is obtained which approximately corresponds to the structure of the cross section in FIG. 6, the metallic reinforcement 20 assuming the position of the resist mask 10. The structure in accordance with FIG. 7 is then produced by the etching of the covering film 7 and of the reinforcement 20 present thereon. The openings in the covering film 7 are formed in this case without the removal of the covering film in the region of the reinforcements 20. By means of this differential etching of the regions of different thicknesses of the covering film and of the covering film with reinforcement, respectively, the structure illustrated in cross section in FIG. 7 can thus be produced in a simple manner. Moreover, the thickness of the reinforcement 20 can be adapted to the respective requirements, such that the housing covers that remain after the differential etching are sufficiently stable for the case where they are subsequently intended to be overmolded, that is to say that a potting compound is intended to be applied thereto. The subsequent method steps correspond to the method steps already described with reference to FIGS. 8 and 9. FIG. 11 illustrates further embodiments of the frames. In the case of a component comprising filter structures which are embodied in a comb-like manner and intermeshed in one another (as in the upper example in FIG. 11), it is advantageous for the electrical properties of the filter if the ground lead to the comb structure is electrically conductively connected to the terminating cover with low impedance by virtue of the ground lead being produced with a metal column 4 (in the form of a web in the embodiment illustrated). The arrangement of one or a plurality of frames alongside a further frame (as in the middle example in FIG. 11) or within a further frame (as in the lower example in FIG. 11) can be expedient in order to lead out further hot (live) lines from a region enclosed by a frame, in order to provide low-inductance ground lines, or else in order to connect ground in series with an inductance.

Typical dimensions of the arrangement are a thickness of the wafer of typically approximately 250 μm to 350 μm before rear-side thinning by grinding that is effected, if appropriate, after singulation (DBG, dicing before grinding), a height of the metal frames of typically approximately 5 μm to 100 μm and a thickness of the metallization 8, applied on the metal frames, of typically approximately 3 μm. The covering film 7 can have a thickness of typically approximately 6 μm to 60 μm.

LIST OF REFERENCE SYMBOLS

1 Wafer
2 Separating line
3 Metal frame
4 Metal column
5 Component structure
6 Conductor track
7 Covering film
8 Metallization
9 Metallization
10 Resist mask
11 Opening above separating line
12 Further opening
13 Insulation layer
14 Opening
16 Insulation
17 Solder resist layer
18 Solder ball
19 Further resist mask
20 Reinforcement
21 Region enclosed by a metal frame
22 Intermediate region
23 Metallization for the connection of the metal frame
24 Metallization for the connection of the outer metal column
30, 31, 32 Metal frame
40 Outer metal column
41, 42, 43 Inner metal column
44 Outer metal column
70 Carrier film
71 Upper metallization
72 Lower metallization

The invention claimed is:

1. A housing for a component comprising
   a substrate having a top side,
   a plurality of frames, which are applied on the top side of the substrate and completely enclose a region of the top side,
   wherein the frames consist of one metal or of two or more metals, and
   wherein at least one column is present which is arranged outside that region of the top side of the substrate which is enclosed by the frames, and
   comprising a covering film, which is applied on the frames and forms a gas-tight connection to the frames, wherein the covering film is subdivided into portions, each portion covering only one unit, and wherein the covering film comprises a metal or a metallization, and
   comprising a conductor track between the top side of the substrate and the frame, wherein the conductor track is connected to the column and to a component structure arranged within that region of the top side which is enclosed by the frames, and the conductor track is electrically insulated from the frames by means of an insulation.

2. The housing as claimed in claim 1, wherein the covering film is a metal, a metal composite or a metal alloy.

3. The housing as claimed in claim 1, wherein the covering film is a carrier film composed of glass, ceramic or plastic that is metallized on one side or on both sides.

4. The housing as claimed in claim 1, wherein at least one column is present which is arranged within that region of the top side of the substrate which is enclosed by the frames, and the column is provided for supporting the covering film or for forming an electrical connection between a component structure and the covering film or for supporting the covering film and for forming an electrical connection between a component structure and the covering film.

5. The housing as claimed in claim 4, wherein the covering film is wholly or partly electrically conductive, and the column forms an electrical connection between a component structure arranged within that region of the top side which is enclosed by the frames and an electrically conductive region of the covering film.

6. The housing as claimed in claim 4, wherein the frames and the column comprise the same metal or the same metals.

7. The housing as claimed in claim 1, wherein the covering film is a metal, a metal composite, a metal alloy, or a carrier film composed of glass, ceramic or plastic that is metallized on one side or on both sides.

8. A method for manufacturing housings for components, wherein a plurality of frames composed of metal are applied galvanically to a top side of a substrate or wafer, said frames in each case completely enclosing a region of the top side, an entire covering film is applied to the frames and a gas-tight connection between the covering film and the frames is produced, wherein the covering film is a metal, a metal composite, a metal alloy, or a carrier film composed of glass, ceramic, or plastic that it metallized on one side or on both sides, the covering film is subdivided into portions that in each case cover a frame and that region of the top side which is enclosed by the frame, the material of the covering film being removed in regions between adjacent frames by etching such that the covering film is subdivided into portions, each portion covering only one unit, before the frames are applied, conductor tracks are applied on the top side, insulations are applied on the conductor tracks to insulate the conductor tracks from the frames, the frames are arranged in sections on the insulations, and columns composed of metal are arranged on the conductor tracks, outside those regions of the top side which are enclosed by the frames.

9. The method as claimed in claim 8, wherein columns are produced by which the covering film is supported.

10. The method as claimed in claim 9, wherein the columns are produced from metal by electroforming together with the frames, the covering film is produced such that it is wholly or partly electrically conductive, and at least some of the columns are connected to an electrically conductive region of the covering film.

11. The method as claimed in claim 10, wherein structured metallizations are produced above the covering film, said metallizations being electrically conductively connected at least to some of the columns.

12. The method as claimed in claim 8, wherein each of the frames consists of one or more metals.

\* \* \* \* \*